(12) United States Patent
Kirk et al.

(10) Patent No.: US 9,839,116 B2
(45) Date of Patent: Dec. 5, 2017

(54) CIRCUIT CARD ASSEMBLY WITH THERMAL ENERGY REMOVAL

(71) Applicant: GE Intelligent Platforms Embedded Systems, Inc., Charlottesville, VA (US)

(72) Inventors: Graham Charles Kirk, Towcester (GB); Zeshan Jabar Hussain, Towcester (GB)

(73) Assignee: Abaco Systems, Inc., Huntsville, AL (US)

( * ) Notice: Subject to any disclaimer, the term of this patent is extended or adjusted under 35 U.S.C. 154(b) by 0 days.

(21) Appl. No.: 14/787,552

(22) PCT Filed: Apr. 29, 2013

(86) PCT No.: PCT/US2013/038638
§ 371 (c)(1),
(2) Date: Oct. 28, 2015

(87) PCT Pub. No.: WO2014/178817
PCT Pub. Date: Nov. 6, 2014

(65) Prior Publication Data
US 2016/0081177 A1  Mar. 17, 2016

(51) Int. Cl.
*H05K 7/20* (2006.01)
*H05K 5/00* (2006.01)
(Continued)

(52) U.S. Cl.
CPC ......... *H05K 1/0203* (2013.01); *H05K 7/1404* (2013.01); *H05K 7/20545* (2013.01)

(58) Field of Classification Search
CPC .. H05K 1/0272; H05K 1/0203; H05K 7/1404; H05K 7/1409; H05K 7/20545;
(Continued)

(56) References Cited

U.S. PATENT DOCUMENTS 3,971,186 A   7/1976   Havelka et al.
4,819,713 A   4/1989   Weisman
(Continued)

OTHER PUBLICATIONS

International Search Report and Written Opinion dated Jan. 7, 2014 which was issued in connection with PCT Patent Application No. PCT/US13/38638 which was filed on Apr. 29, 2015.

*Primary Examiner* — Chau N Nguyen
*Assistant Examiner* — Roshn Varghese
(74) *Attorney, Agent, or Firm* — Meunier Carlin & Curfman LLC

(57) ABSTRACT

A circuit card assembly includes a heat sink, a locking mechanism, a first thermal path, and a second thermal path. The heat sink couples to a circuit board and has an upper surface and a lower surface. The heat sink has a channel extending downward along the upper surface of the heat sink. The locking mechanism is disposed within the channel and includes a plurality of solid wedges movably arranged within the channel. Movement of the wedges is effective to secure the circuit card assembly to a holder. The first thermal path extends from the circuit board through the heat sink to the lower surface of the heat sink and removes thermal energy from the circuit board. The second thermal path is formed from the circuit board, through the heat sink, and then through the wedges to the holder. The second thermal path removes thermal energy from the circuit board that is greater than a leakage amount.

14 Claims, 9 Drawing Sheets

(51) Int. Cl.
*H05K 1/14* (2006.01)
*H05K 1/02* (2006.01)
*H05K 7/14* (2006.01)

(58) Field of Classification Search
CPC .. H05K 7/1401; H05K 7/1402; H05K 7/1405; H05K 7/1407; H05K 7/1408; F16B 2/14; H01R 12/7005
USPC .......................................................... 361/719
See application file for complete search history.

(56) References Cited

U.S. PATENT DOCUMENTS

| | | |
|---|---|---|
| 4,824,303 A | 4/1989 | Dinger |
| 4,879,634 A | 11/1989 | Storrow et al. |
| 4,909,752 A | 3/1990 | Hallum et al. |
| 5,010,444 A | 4/1991 | Storrow et al. |
| 5,071,013 A | 12/1991 | Peterson |
| 5,220,485 A | 6/1993 | Chakrabarti |
| 5,224,016 A | 6/1993 | Weisman et al. |
| 5,859,764 A | 1/1999 | Davis et al. |
| 6,212,075 B1 | 4/2001 | Habing et al. |
| 6,285,564 B1 | 9/2001 | O'Brien |
| 6,687,130 B2 | 2/2004 | Adams, Sr. et al. |
| 7,031,167 B1 | 4/2006 | Zagoory et al. |
| 7,180,737 B2 | 2/2007 | Straub, Jr. et al. |
| 7,322,843 B1 | 1/2008 | Lee et al. |
| 7,349,221 B2 | 3/2008 | Yurko |
| 8,045,332 B2 | 10/2011 | Lee et al. |
| 9,466,551 B1* | 10/2016 | Reist ..................... H01L 23/473 |
| 2003/0223197 A1* | 12/2003 | Hulan ................ H05K 7/20545 361/719 |
| 2007/0253169 A1 | 11/2007 | Clawser |
| 2008/0239690 A1 | 10/2008 | Harvey et al. |
| 2011/0261537 A1 | 10/2011 | Sporer et al. |
| 2012/0087089 A1* | 4/2012 | Monson ............. H05K 7/20545 361/700 |
| 2014/0314514 A1* | 10/2014 | Paquette ............. H05K 7/1404 29/428 |

* cited by examiner

CIRCUIT CARD ASSEMBLY WITH THERMAL ENERGY REMOVAL

BACKGROUND OF THE INVENTION

Field of the Invention

The subject matter disclosed herein relates circuit card assemblies and, more specifically, to removing thermal energy from circuit card assemblies associated with or coupling to these assemblies.

Brief Description of the Related Art

Circuit card assemblies are used for various purposes in today's electronic systems. The circuit card assemblies may include microprocessors (or other integrated circuits), or passive components such as resistors, capacitors, or inductors to mention a few examples. These circuit card assemblies are often arranged in a chassis. As the circuit card assemblies are operated, heat is generated by the electrical components disposed on these cards. Even if the components are not damaged by the heat, the operation of the circuit card assemblies may become inefficient due to the heat. If this heat is not removed however, it may cause damage to the circuit card assemblies or other devices that are near the circuit card.

Circuit card assemblies are held in place to the chassis by various types of locking arrangements. One such locking arrangement are wedge locks attached to the edges of the circuit card assembly. The wedge lock retains the circuit card assembly in the chassis and is a standardized design that fits within a chassis. When viewed in cross section, current heat sink designs typically have two portions that are integrally formed together and connected by an integral neck. Heat is removed from the circuit card in to the heat sink passing through a first of these portions, through the neck, through the second portion and then exiting the arrangement.

Unfortunately, the neck area in these previous arrangements is small which increases the thermal resistance of the circuit card heat sink. Due to the dimensional constraints of the wedge lock and the circuit card assembly themselves and other factors, it is not uncommon for the neck to be less than 1 mm in dimension. This type of sizing reduces thermal transfer in the system such that the performance of the circuit card assembly is reduced or components are damaged.

Previous attempts to increase the size of the neck to increase and improve the thermal paths have involved re-arranging the standard layout of the wedge lock assembly. Unfortunately, this disturbs the layout of the wedge lock and makes it unacceptable for many applications.

BRIEF DESCRIPTION OF THE INVENTION

The present approaches remove the central screw/shaft from a locking mechanism that is used to effectuate a force on the wedges, and moves the wedge face surfaces to the center of the device thereby creating a broader thermal path. In so doing, the size of the neck is increased thus reducing the thermal resistance in that area. In other aspects, an additional thermal path is created through the wedges themselves and this thermal path conducts an amount of thermal energy that is an order of magnitude less in proportion to the main thermal path.

In many of these embodiments, a circuit card assembly includes a heat sink, a locking mechanism, a first thermal path, and a second thermal path. The heat sink is thermally coupled to a circuit board and has an upper surface and a lower surface. The heat sink has a pair of longitudinal channels extending downward along the upper surface.

The locking mechanism is disposed within the longitudinal channel of the heat sink and includes a plurality of solid wedges movably arranged within the longitudinal channel. The solid wedges are formed without openings or channels there through and the longitudinal movement of the plurality of solid wedges within the channel is effective to secure the circuit card assembly to an external holder.

The first thermal path is formed from the circuit board through the heat sink to the lower surface of the heat sink in contact with the external holder. The first thermal path is effective to remove a first amount of thermal energy from the circuit board.

The second thermal path is formed from the circuit board, through the heat sink, and then through at least some of the plurality of solid wedges to the holder. The second thermal path is effective to remove a second amount of thermal energy from the circuit board that is a leakage amount roughly an order of magnitude less than the first amount associated with the first thermal path.

In other aspects, a rod or other member being constructed of a material different from the heat sink extends longitudinally through the heat sink and forms an isothermal section in the heat sink. By "isothermal section," it is meant the temperature is evenly dispersed across the length of the rod and the surrounding heat sink, which allows thermal energy to be more efficiently removed from the circuit board assembly. In one example, the rod is constructed of copper. In other examples, other materials or thermal solutions may be used (e.g., vapor chambers).

In some examples, each of the plurality of wedges are generally T-shaped in a cross-section. In other examples, each of the plurality of wedges are generally J-shaped in a cross-section. Other cross-sectional shapes may also be used.

In some aspects, a bottom surface of each of the plurality of wedges is generally flat. In other aspects, the locking apparatus further includes a screw apparatus that is configured to, upon actuation, move the plurality of wedges. In still other aspects, the locking apparatus further includes a stopping mechanism that halts movement of the plurality of wedges along the longitudinal channel.

In others of these embodiments, a circuit card assembly includes a heat sink, a locking mechanism, a first thermal path, and a second thermal path. The heat sink has a first portion and a second portion. The first portion is thermally coupled to the circuit board and the first and second portions are formed integrally together and connected via an integral neck portion. The heat sink includes an upper surface and a lower surface. The heat sink further includes a longitudinal channel extending downward along the upper surface of the heat sink.

The locking mechanism is disposed within the longitudinal channel of the heat sink and includes a plurality of solid wedges movably arranged within the longitudinal channel. The solid wedges are formed without openings there through and longitudinal movement of the plurality of solid wedges within the channel is effective to secure the circuit card assembly to an external holder.

The first thermal path is formed from the circuit board through the first portion of the heat sink, through the neck, through the second portion of the heat sink, to the lower surface of the heat sink in contact with the external holder. The first thermal path is effective to remove a first amount of thermal energy away from the circuit board.

The second thermal path is formed from the circuit board, through the first portion of the heat sink, through the second portion of the heat sink, and then through at least some of the plurality of solid wedges to the holder. The second thermal path is effective to remove a second amount of thermal energy from the circuit board that is a leakage amount roughly an order of magnitude less than the first amount associated with the first thermal path.

The neck portion of the heat sink is of dimensions sufficient to prevent a creation of a significant thermal resistance between the first portion and the second portion of the heat sink.

BRIEF DESCRIPTION OF THE DRAWINGS

For a more complete understanding of the disclosure, reference should be made to the following detailed description and accompanying drawings wherein.

Figure 1:
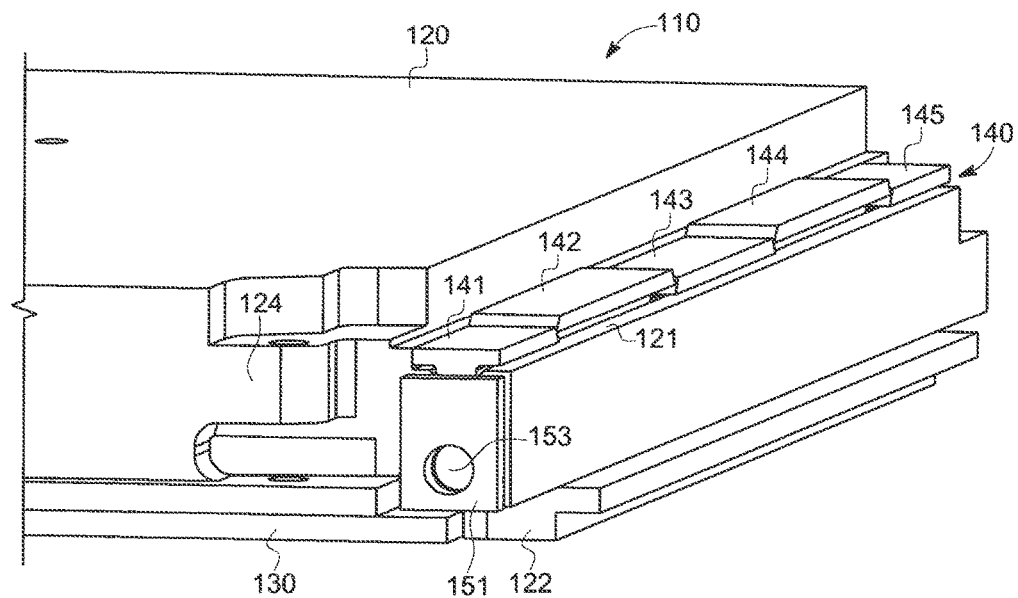
FIG. 1 comprises a perspective view of a circuit card assembly according to various embodiments of the present invention.
Figure 2:
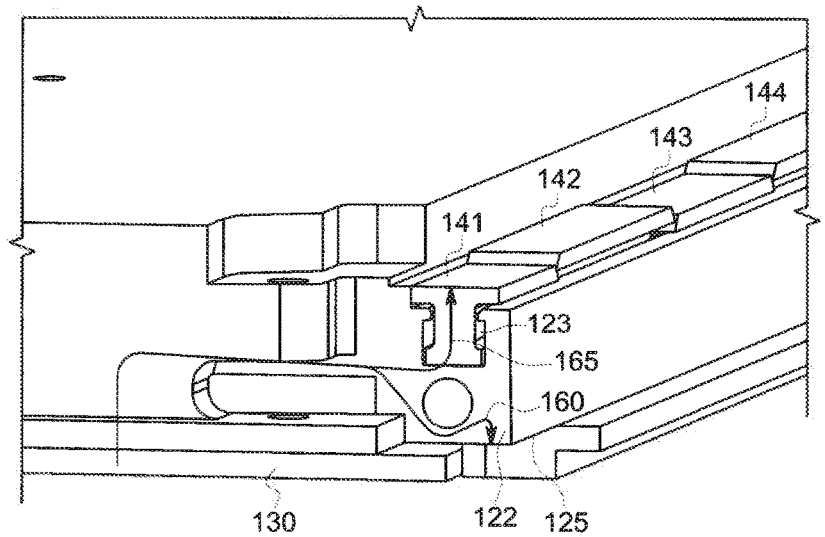
FIG. 2 comprises a perspective view of the circuit card assembly of FIG. 1 according to various embodiments of the present invention.

Skilled artisans will appreciate that elements in the figures are illustrated for simplicity and clarity. It will further be appreciated that certain actions and/or steps may be described or depicted in a particular order of occurrence while those skilled in the art will understand that such specificity with respect to sequence is not actually required. It will also be understood that the terms and expressions used herein have the ordinary meaning as is accorded to such terms and expressions with respect to their corresponding respective areas of inquiry and study except where specific meanings have otherwise been set forth herein.

DETAILED DESCRIPTION OF THE INVENTION

The approaches described herein provide an improved circuit card assembly locking arrangement (e.g., a locking wedge approach) that reduces the size of the device in the cross-section and which leaves more material in the neck region of the heat sink. This results in a decrease in the overall thermal resistance of the thermal path available for thermal energy to be ultimately dissipated.

In other aspects, an additional thermal path is created through the wedges that are used in the locking mechanism thereby further reducing the overall thermal resistance of the system. More specifically and to take one example, the central screw or shaft of previous arrangements is removed and an alternative path for heat to escape is added.

By staying within existing sizing standards, these approaches can be implemented in existing configurations without requiring modifications to circuit card assembly Chassis. Thus, the layout of current systems is not disturbed.

Further, when the circuit operates at a reduced temperature, the speed of microprocessors (or other electrical components) may be increased. This advantage could be used to keep the temperature of critical devices on the circuit board under their junction temperature limit when running at elevated environmental temperatures or to increase the speed of the processor whilst staying below the junction temperature.

In still other aspects, a rod (or other heat spreader) may be deployed to provide for further heat dissipation. The present approaches also reduce costs for the apparatus since less parts are used compared to previous approaches.

To give a specific example of the application of the present approaches, a neck of approximately 3 mm or more is created for the thermal path in a locking wedge-type circuit card assembly apparatus. In one example and when the circuit board attached to the assembly includes a microprocessor, the present approaches reduce the temperature of the microprocessor by approximately 2.5 degrees centigrade. The larger neck section that is created also allows for incorporating heat spreading devices (such as copper rods, heat pipes, thermal ground planes, and graphite rods to mention a few examples) into the assembly. These additional heat-spreading devices spread the heat along the entire length of the assembly and further reduce the temperature of the attached circuit card (and the components deployed on the card).

Referring now to FIGS. 1-7, one example of a circuit card assembly is described. The circuit card assembly 110 includes a heat sink 120, a circuit board 130, a locking mechanism 140, a first thermal path 160, and a second thermal path 165. The heat sink 120 has a first portion 124 and a second portion 125. The first portion 124 is coupled to the circuit board 130. The first portion 124 and the second portion 125 are formed integrally together and connected via an integral neck portion 126.

The heat sink 120 is constructed of aluminum or other metals having similar thermal characteristics. In one example, the integral neck portion 126 of the circuit card assembly 110 is increased in dimensions to approximately 3.47 mm×1.85 mm, thereby increasing the thermal path for thermal energy exiting the circuit board 130.

The heat sink 120 includes an upper surface 121 and a lower surface 122. The heat sink 120 further includes a longitudinal channel 123 extending downward along the upper surface 121 of the heat sink 120. The dimensions of the longitudinal channel 123 are approximately 120 mm long and 4 mm deep, in one example. Other dimensions are possible.

Figure 17:
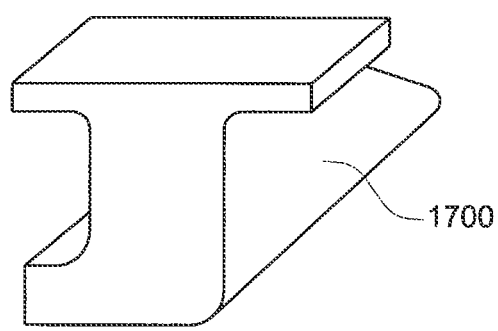
FIG. 17 comprises a perspective view of a wedge shaped in a J-like cross-sectional configuration according to various embodiments of the present invention.

The locking mechanism 140 is disposed within the longitudinal channel 123 of the heat sink 120 and includes a first solid wedge 141, a second solid wedge 142, a third solid wedge 143, a fourth solid wedge 144, and a fifth solid wedge 145 that are all movably arranged within the longitudinal channel 123. It will be appreciated that in other examples, there may be more or less than five solid wedges. The first solid wedge 141, second solid wedge 142, third solid wedge 143, fourth solid wedge 144, and fifth solid wedge 145 are formed without openings there through (e.g., they are solid) and longitudinal movement of the plurality of solid wedges within the channel is effective to secure the circuit card assembly 110 to an external holder 180. In some examples, each of a plurality of wedges are generally T-shaped in the cross section. In other examples, such as shown in FIG. 17, each of the plurality of wedges are generally J-shaped in a cross section. Other cross-sectional shapes may also be used. In some aspects, a bottom surface of each of the plurality of wedges is generally flat. The wedges are constructed of aluminum or other metals having similar thermal characteristics. In one example, the wedges are approximately 21 mm tall, 4.8 mm wide, and 4.75 mm deep. Other dimensions are possible.

Figure 3:
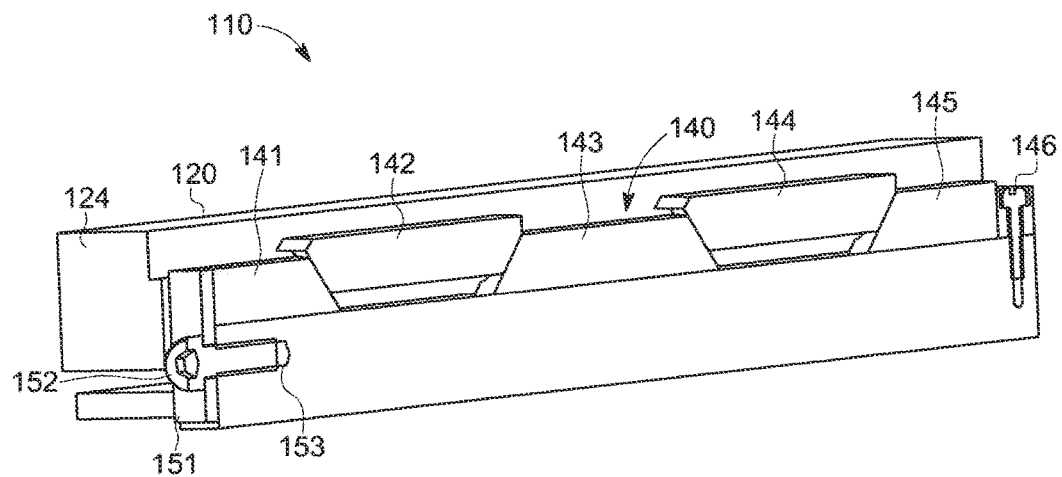
FIG. 3 comprises a cross sectional view of the circuit card assembly of FIGS. 1-2 according to various embodiments of the present invention.
Figure 4:
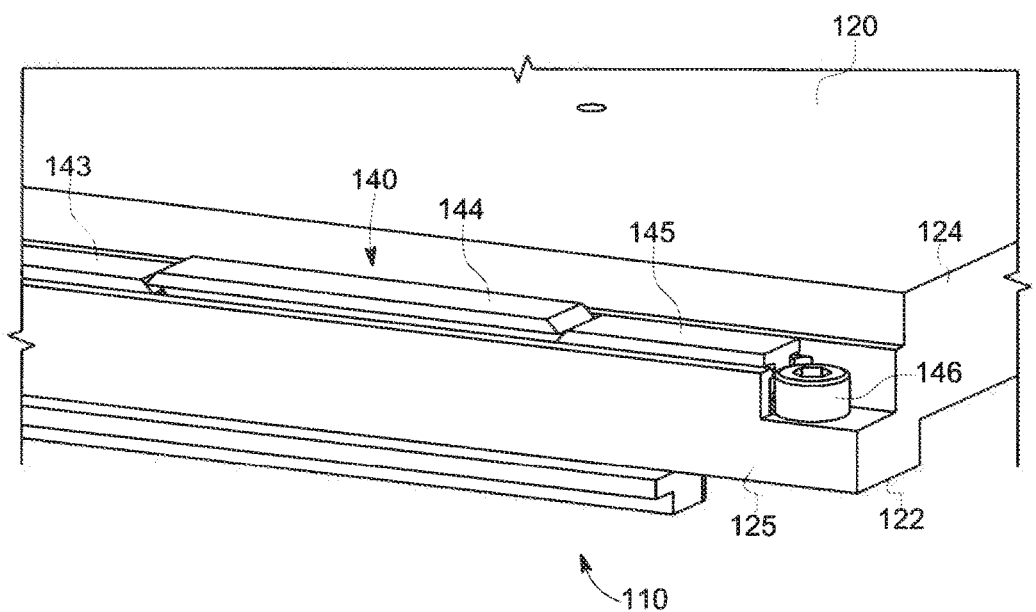
FIG. 4 comprises a perspective view of the circuit card assembly of FIG. 1-3 according to various embodiments of the present invention.
Figure 5:
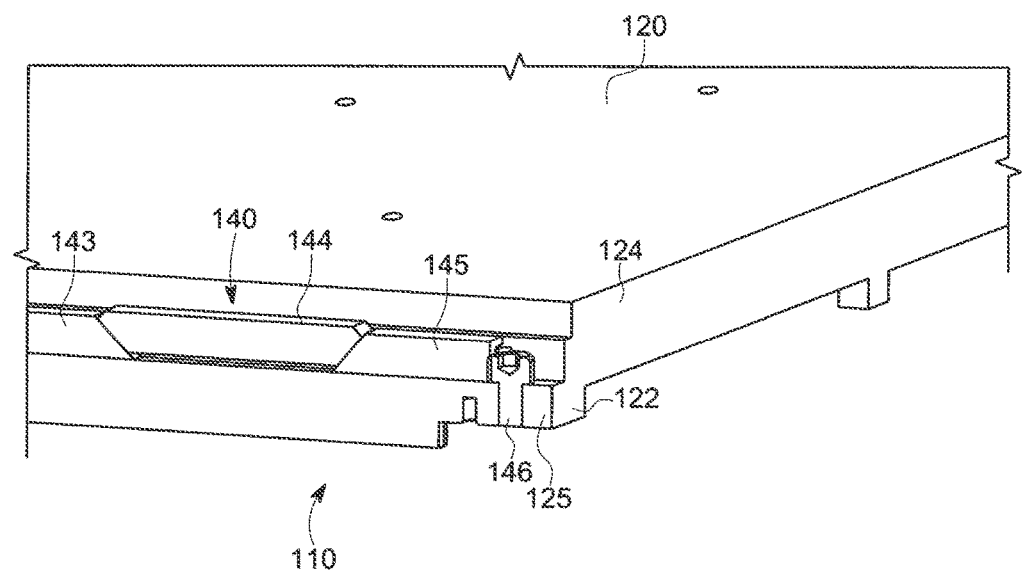
FIG. 5 comprises a cross sectional view of the circuit card assembly of FIGS. 1-4 according to various embodiments of the present invention.
Figure 6:
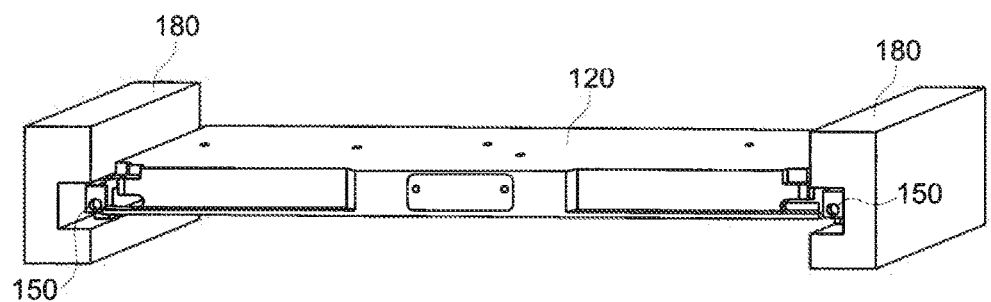
FIG. 6 comprises a perspective view of the circuit card assembly of FIG. 1-5 according to various embodiments of the present invention.
Figure 7:
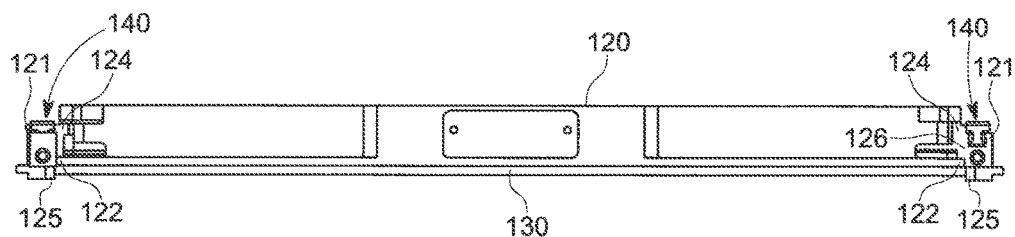
FIG. 7 comprises a front view of the circuit card assembly of FIGS. 1-6 according to various embodiments of the present invention.
Figure 8:
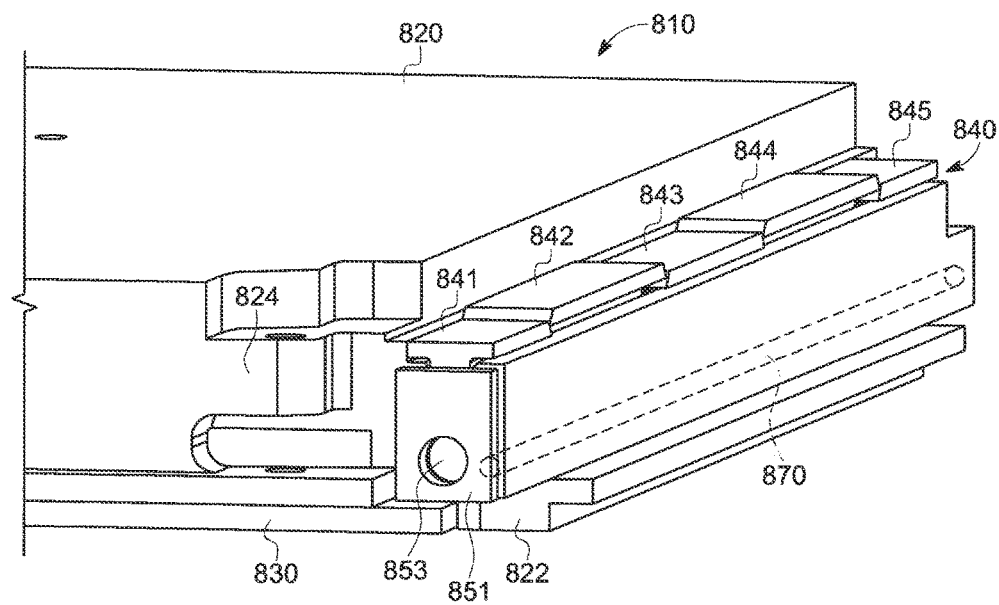
FIG. 8 comprises a perspective view of a circuit card assembly with a rod according to various embodiments of the present invention.
Figure 9:
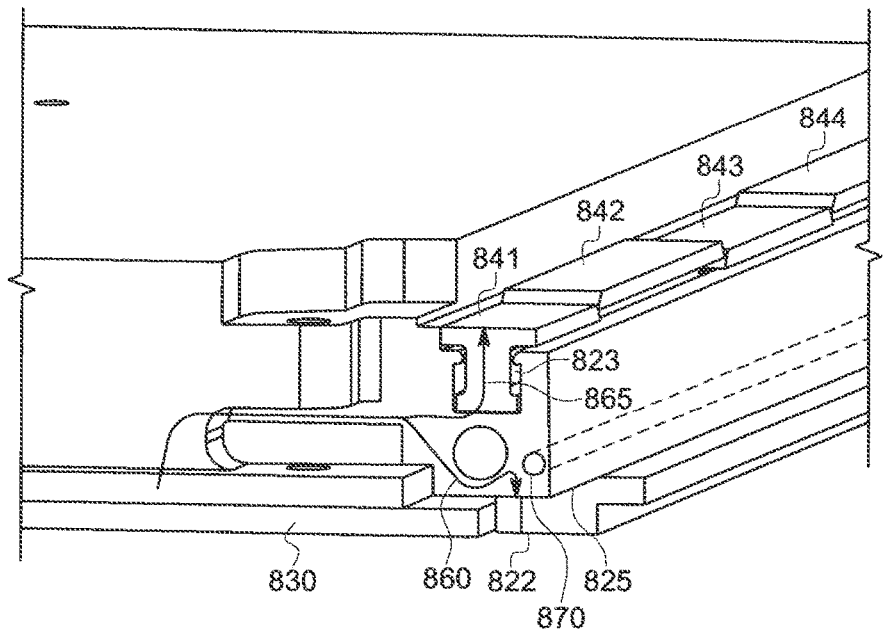
FIG. 9 comprises a perspective view of the circuit card assembly of FIG. 8 according to various embodiments of the present invention.

With exception to the front surface of the first solid wedge 141 and the rear-most surface of the fifth solid wedge 145, adjoining surfaces of the wedges are angled at approximately 45 degrees from vertical as shown in the cross sectional view of FIG. 3. More specifically, in the first solid wedge 141, third solid wedge 143, and fifth solid wedge 145, the approximately 45 degree angle from vertical results in the wedges having an acute angle of approximately 45 degrees. In the second solid wedge 142 and the fourth solid wedge 144, the approximately 45 degree angle from vertical results in the wedges having an obtuse angle of approximately 135 degrees.

The external holder 180 is generally "C" or "U" shaped and can be constructed of a metal. The protruding surfaces of the external holder 180 are configured to be planar. The external holder 180 is integral or attached to the chassis (not shown in FIGS. 1-7) through conventional methods including, for example, bolting, screwing, gluing, or other methods.

In some aspects, the locking mechanism 140 includes a stopper 146 (e.g., a bolt or screw constructed of stainless steel which is inserted into the heat sink 120 to halt movement of the plurality of wedges along the longitudinal channel 123. The head of the stopper 146 protrudes from the heat sink 120, and maintains contact with the rear surface of the fifth solid wedge 145 to restrict movement of the fifth solid wedge 145 and thus the locking mechanism (described in detail below). Other locking mechanisms are possible.

In other aspects, the locking mechanism 140 further includes a screw apparatus 150 that is configured to, upon actuation, move the plurality of wedges. The screw apparatus 150 includes the screw apparatus plate 151, screw 152, and threaded screw channel 153. The screw apparatus plate 151 contains a hole through which the screw 152 is inserted, and is further inserted into the threaded screw channel 153. Thus, the screw apparatus plate 151 is positioned between the head of the screw 152 and the heat sink 120. The rear surface of the screw apparatus plate 151 is in contact with the front surface of the first solid wedge 141. The screw apparatus plate 151 and screw 152 are constructed of stainless steel. The threaded screw channel 153 extends a distance of approximately 20 mm into the heat sink 120. Other locking mechanisms are possible.

In other aspects, to lock the circuit card assembly 110 to the external holder 180, a user rotates the screw 152 into the threaded screw channel 153, which causes the screw apparatus plate 151 to affect a force against the first solid wedge 141 in the direction of the longitudinal channel 123. In response to this force, the first solid wedge 141 moves in the longitudinal channel 123 and presses against the second solid wedge 142, the second solid wedge 142 moves in the longitudinal channel 123 and presses against the third solid wedge 143, and so on until the fifth solid wedge 145 presses against the stopper 146.

Because the stopper 146 restricts further movement of the wedges into the longitudinal channels, upon tightening the screw 152 into the threaded screw channel 153, the fifth solid wedge 145 exerts a force against the rear surface of the fourth solid wedge 144. Because the rear surface of the fourth solid wedge 144 is angled at approximately 45 degrees from vertical and forms an obtuse angle of approximately 135 degrees, the force exerted by the fifth solid wedge 145 provides a force on the fourth solid wedge 144 causing it to rise in the direction perpendicular to the longitudinal channel 123.

As the screw 152 is further tightened, the fourth solid wedge 144 continues to rise in the direction perpendicular to the longitudinal channel 123 until the topmost surface of the fourth solid wedge 144 comes in contact with and presses against the inner surface of the external holder 180. This resistive force exerted by the external holder 180 causes the first solid wedge 141 to move toward the third solid wedge 143. As a result of this rotation of the screw 152, the distance between the first solid wedge 141, third solid wedge 143, and fifth solid wedge 145 is reduced. Because the front and rear surfaces of the second solid wedge 142 are angled at approximately 45 degrees from vertical and form obtuse angles of approximately 135 degrees and the rear surface of the first solid wedge 141 and the front surface of the third solid wedge 143 form supplementary angles with those of the second solid wedge 142, the forces exerted by the first solid wedge 141 and the third solid wedge 143 cause the second solid wedge 142 to rise in a direction perpendicular to the longitudinal channel 123.

When the fourth solid wedge 144 and subsequently the second solid wedge 142 rise in the direction perpendicular to the longitudinal channel 123, the topmost surfaces of these wedges come in contact with and press against the inner surface of the external holder 180. Upon further rotating the screw 152, thus further raising the second solid wedge 142, the external holder 180 exerts an opposite retention force on the wedges, which results in the circuit card assembly 110 being secured to the external holder 180 which is secured to the chassis. The circuit card assembly 110 is therefore clamped in the external holder 180 between the lower surface 122 of the heat sink 120 and the second solid wedge 142 and fourth solid wedge 144.

The circuit board 130 is any type of circuit board that has a variety of different components. For example, various resistors, integrated circuits, capacitors, are disposed on the circuit board 130. These components generate heat that is dispersed according to the present approaches. The circuit board 130 includes a circuit board external connector (not shown for simplicity) to provide the circuit board 130 with electrical power and to allow the transmission of data. The circuit board external connector may be one of several commonly-used connectors, for example, Vita 46 and 48 Standard connectors (VPX), Versa Module Eurocard (VME) connectors, or Compact PCi (CPCi) connectors. Skilled artisans will appreciate that a number of different connections may be utilized to transmit power and data to and from the circuit board 130.

The first thermal path 160 is formed from the circuit board 130 through the first portion 124 of the heat sink 120, through the integral neck portion 126 of the heat sink 120, through the second portion 125 of the heat sink 120, to the lower surface 122 of the heat sink 120. The first thermal path 160 is effective to remove a first amount of thermal energy away from the circuit board 130. This is accomplished because the lower surface 122 of the heat sink 120 is in contact with the external holder 180, which creates a thermal interface allowing for thermal energy to be removed to the external holder 180.

The integral neck portion 126 of the heat sink 120 is of dimensions sufficient to prevent a creation of a significant thermal resistance between the first portion 124 and the second portion 125 of the heat sink 120. For example, the neck dimensions can vary between approximately 2 mm and 6 mm to accomplish this function.

The second thermal path 165 is formed from the circuit board 130, through the first portion 124 of the heat sink 120, through the integral neck portion 126 of the heat sink 120, through the second portion 125 of the heat sink 120, and then through at least some of the first solid wedge 141, second solid wedge 142, third solid wedge 143, fourth solid wedge 144, and fifth solid wedge 145 to the external holder 180. The second thermal path 165 is effective to remove a second amount of thermal energy from the circuit board 130 that is greater than a leakage amount. This is accomplished because the top surfaces of the wedges in contact with the external holder 180 create a thermal interface allowing for thermal energy to be removed.

It is understood that the term "thermal interface" is to describe any cooperation of component surfaces which, when in direct or close contact with one another, allow for thermal energy to be transferred there between. This may involve the additional use of paste, pads, tape, films, soldering or other existing methods.

Referring now to FIGS. 8-14, another example of a circuit card assembly 810 is described. The circuit card assembly 810 includes a heat sink 820, a locking mechanism 840, a first thermal path 860, and a second thermal path 865. The heat sink 820 has a first portion 824 and a second portion 825. The first portion 824 is coupled to the circuit board 830 and the first portion 824 and second portion 825 are formed integrally together and connected via an integral neck portion 826.

The heat sink 820 is constructed of aluminum or other metals having similar thermal characteristics. The integral neck portion 826 is increased to approximately 3.47 mm×1.85 mm, thereby increasing the thermal path for thermal energy exiting the circuit board 830.

The heat sink 820 includes an upper surface 821 and a lower surface 822. The heat sink 820 further includes a longitudinal channel 823 extending downward along the upper surface 821 of the heat sink 820. The dimensions of the longitudinal channel 823 are approximately 120 mm long and 4 mm deep, in one example. Other dimensions are possible The locking mechanism 840 is disposed within the longitudinal channel 823 of the heat sink 820 and includes a plurality of a first solid wedge 841, a second solid wedge 842, a third solid wedge 843, a fourth solid wedge 844, and a fifth solid wedge 845 movably arranged within the longitudinal channel 823. The wedges are formed without openings there through (e.g., they are solid) and longitudinal movement of the plurality of solid wedges within the channel is effective to secure the circuit card assembly 810 to an external holder 880. In some examples, the wedges are generally T-shaped in a cross section. In other examples, and as shown in FIG. 17, each of the plurality of wedges are generally J-shaped in a cross section. Other cross-sectional shapes may also be used. In some aspects, a bottom surface of each of the plurality of wedges is generally flat. The wedges are constructed of aluminum or other metals having similar thermal characteristics. In one example, the wedges are approximately 21 mm tall, 4.8 mm wide, and 4.75 mm deep. Other dimensions are possible.

Figure 10:
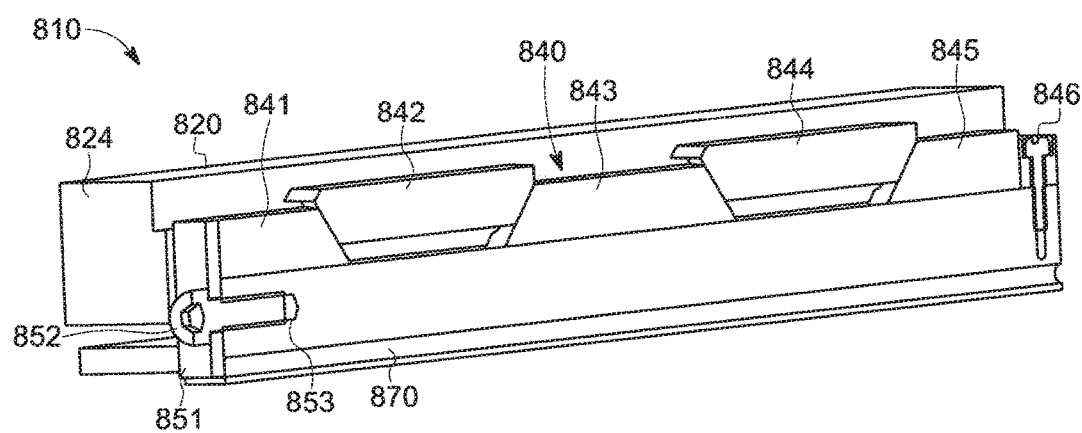
FIG. 10 comprises a cross sectional view of the circuit card assembly of FIGS. 8-9 according to various embodiments of the present invention.
Figure 11:
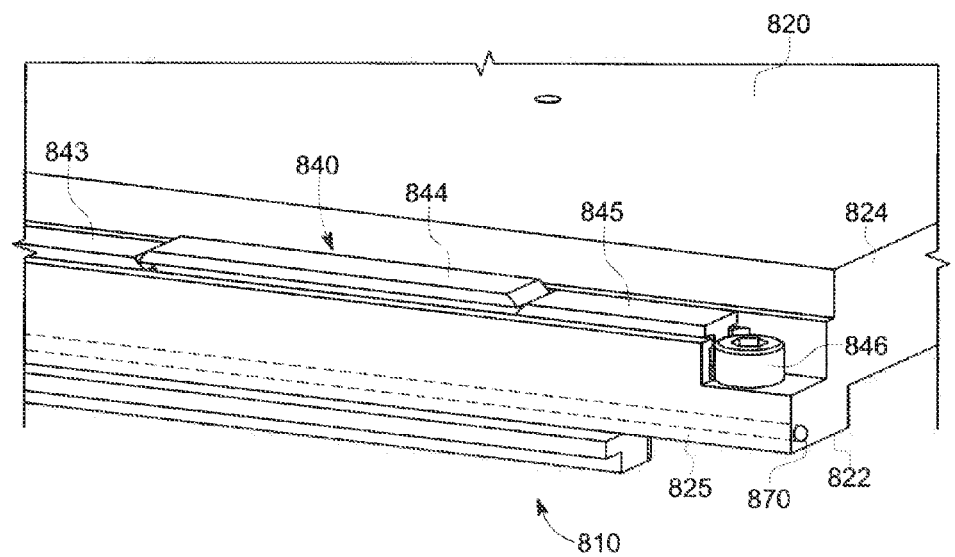
FIG. 11 comprises a perspective view of the circuit card assembly of FIGS. 8-10 according to various embodiments of the present invention.
Figure 12:
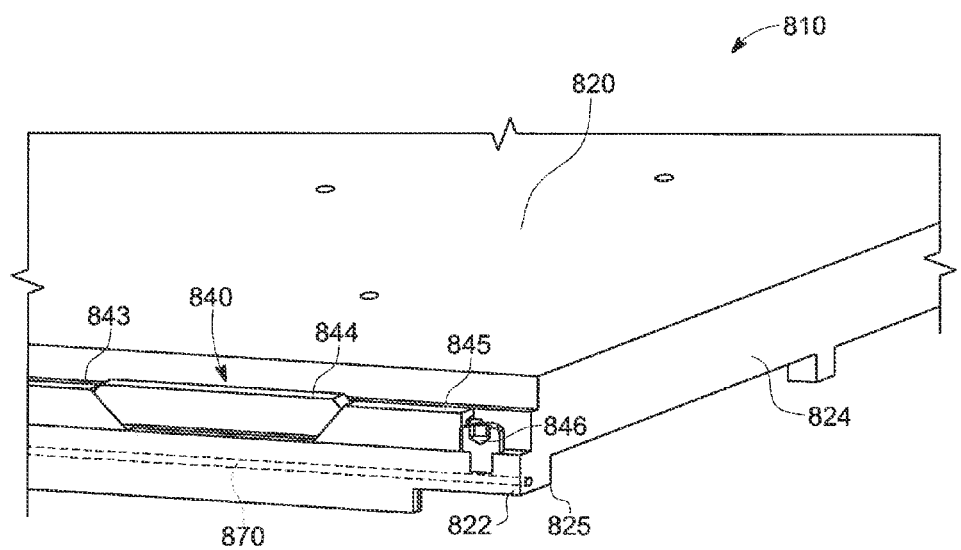
FIG. 12 comprises a cross-sectional view of the circuit card assembly of FIGS. 8-11 according to various embodiments of the present invention.
Figure 13:
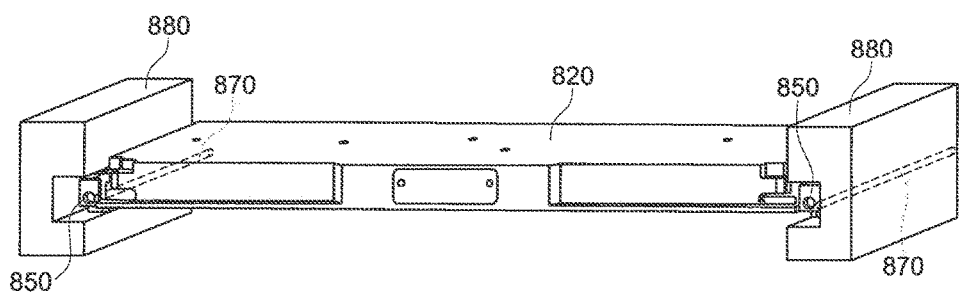
FIG. 13 comprises a perspective view of the circuit card assembly of FIGS. 8-12 according to various embodiments of the present invention.
Figure 14:
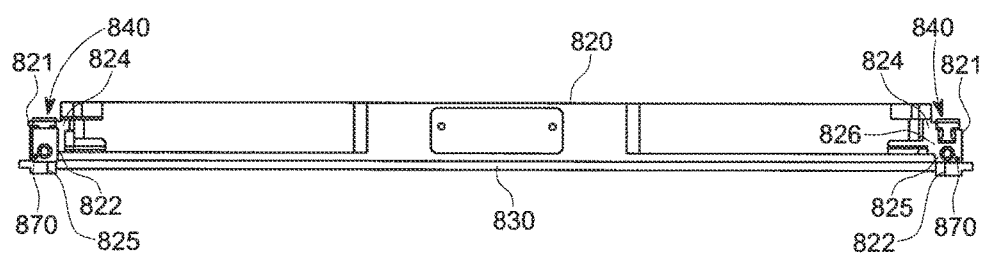
FIG. 14 comprises a front view of the circuit card assembly of FIGS. 8-13 according to various embodiments of the present invention.

With exception to the front surface of the first solid wedge 841 and the rear-most surface of the fifth solid wedge 845, adjoining surfaces of the wedges are angled at approximately 45 degrees from vertical as shown in the cross sectional view of FIG. 10. More specifically, in the first solid wedge 841, third solid wedge 843, and fifth solid wedge 845, the approximately 45 degree angle from vertical results in the wedges having an acute angle of approximately 45 degrees. In the second solid wedge 842 and the fourth solid wedge 844, the approximately 45 degree angle from vertical results in the wedges having an obtuse angle of approximately 135 degrees.

The external holder 880 is generally "C" or "U" shaped and can be constructed of a metal. The protruding surfaces of the external holder 880 are configured to be planar. The external holder 880 is integral or attached to the chassis (not shown in FIGS. 1-7) through conventional methods including, for example, bolting, screwing, gluing, or other methods.

In some aspects, the locking mechanism 840 includes a stopper 846 is a bolt or screw constructed of stainless steel which is inserted into the heat sink 820 to halt movement of the plurality of wedges along the longitudinal channel 823. The head of the Stopper 846 protrudes from the heat sink 820, and maintains contact with the rear surface of the fifth solid wedge 845 to restrict movement of the fifth solid wedge 845 and thus the locking mechanism.

In other aspects, the locking mechanism 840 further includes a screw apparatus 850 that is configured to, upon actuation, move the plurality of wedges. The screw apparatus 850 includes the screw apparatus plate 851, screw 852, and threaded screw channel 853. The screw apparatus plate 851 contains a hole through which the screw 852 is inserted, and is further inserted into the threaded screw channel 853. Thus, the screw apparatus plate 851 is positioned between the head of the screw 852 and the heat sink 820. The rear surface of the screw apparatus plate 851 is in contact with the front surface of the first solid wedge 841. The screw apparatus plate 851 and screw 852 are constructed of stainless steel. The threaded screw channel 853 extends a distance of approximately 20 mm into the heat sink 820.

In still other aspects, to lock the circuit card assembly 810 to the external holder 880, a user rotates the screw 852 into the threaded screw channel 853, which causes the screw apparatus plate 851 to affect a force against the first solid wedge 841 in the direction of the longitudinal channel 823. In response to this force, the first solid wedge 841 moves in the longitudinal channel 823 and presses against the second solid wedge 842, the second solid wedge 842 moves in the longitudinal channel 823 and presses against the third solid wedge 843, and so on until the fifth solid wedge 845 presses against the stopper 846.

Because the stopper 846 restricts further movement of the wedges into the longitudinal channels, upon tightening the screw 852 into the threaded screw channel 853, the fifth solid wedge 845 exerts a force against the rear surface of the fourth solid wedge 844. Because the rear surface of the fourth solid wedge 844 is angled at approximately 45 degrees from vertical and forms an obtuse angle of approximately 135 degrees, the force exerted by the fifth solid wedge 845 provides a force on the fourth solid wedge 844 causing it to rise in the direction perpendicular to the longitudinal channel 823.

As the screw 852 is further tightened, the fourth solid wedge 844 continues to rise in the direction perpendicular to the longitudinal channel 823 until the topmost surface of the fourth solid wedge 844 comes in contact with and presses against the inner surface of the external holder 880. This resistive force exerted by the external holder 880 causes the first solid wedge 141 to move toward the third solid wedge 843. As a result of this rotation of the screw 852, the distance between the first solid wedge 841, third solid wedge 843, and fifth solid wedge 845 is reduced. Because the front and rear surfaces of the second solid wedge 842 are angled at approximately 45 degrees from vertical and form obtuse angles of approximately 135 degrees and the rear surface of the first solid wedge 841 and the front surface of the third solid wedge 843 form supplementary angles with those of the second solid wedge 842, the forces exerted by the first solid wedge 841 and the third solid wedge 843 cause the second solid wedge 842 to rise in a direction perpendicular to the longitudinal channel 823.

When the fourth solid wedge 844 and subsequently the second solid wedge 842 rise in the direction perpendicular to the longitudinal channel 823, the topmost surfaces of these wedges come in contact with and press against the inner surface of the external holder 880. Upon further rotating the screw 852, thus further raising the second solid wedge 842, the external holder 880 exerts an opposite retention force on the wedges, which results in the circuit card assembly 810 being secured to the external holder 880 which is secured to the chassis. The circuit card assembly 810 is therefore clamped in the external holder 880 between the lower surface 822 of the heat sink 820 and the second solid wedge 842 and fourth solid wedge 844.

The circuit board 830 is any type of circuit board that has a variety of different components. For example, various resistors, integrated circuits, capacitors, are disposed on the circuit board 830. These components generate heat that is dispersed according to the present approaches. The circuit board 830 includes a circuit board external connector (not shown for simplicity) to provide the circuit board 830 with electrical power and to allow the transmission of data. The circuit board external connector may be one of several commonly-used connectors, for example VPX, VME, or CPCi connectors. Skilled artisans will appreciate that a number of different connections may be utilized to transmit power and data to and from the circuit board 830.

A rod 870 constructed of a material different from the heat sink 820, extends longitudinally through the heat sink 820 and forms an isothermal section in the heat sink 820. In some examples, the rod 870 is cylindrical and has a diameter of approximately 4 mm. In some examples, the rod 870 is placed approximately 2 mm below the locking mechanism 840. In some examples, the rod 870 is constructed of copper. In some aspects, the use of the rod 870 creates an isothermal section in the heat sink 820. By isothermal section, it is meant the temperature surrounding the rod 870 in the heat sink 820 is evenly dispersed across the entire length of the rod 870 which allows thermal energy to be more efficiently removed from the circuit board 830.

The first thermal path 860 is formed from the circuit board 830 through the first portion 824 of the heat sink 820, through the integral neck portion 826 of the heat sink 820, through the second portion 825 of the heat sink 820, to the lower surface 822 of the heat sink 820. The first thermal path 860 is effective to remove a first amount of thermal energy away from the circuit board 830. This is accomplished because the lower surface 822 of the heat sink 820 is in contact with the external holder 880, which creates a thermal interface allowing for thermal energy to be removed to the external holder 880.

The integral neck portion 826 of the heat sink 820 is of dimensions sufficient to prevent a creation of a significant thermal resistance between the first portion 824 and the second portion 825 of the heat sink 820. For example, the neck dimensions can vary between approximately 2 mm and 6 mm.

The second thermal path 865 is formed from the circuit board 830, through the first portion 824 of the heat sink 820, through the integral neck portion 826 of the heat sink 820, through the second portion 825 of the heat sink 820, and then through at least some of the first solid wedge 841, second solid wedge 842, third solid wedge 843, fourth solid wedge 844, and fifth solid wedge 845 to the external holder 880. The second thermal path 865 is effective to remove a second amount of thermal energy from the circuit board 830 that is greater than a leakage amount.

Figure 15:
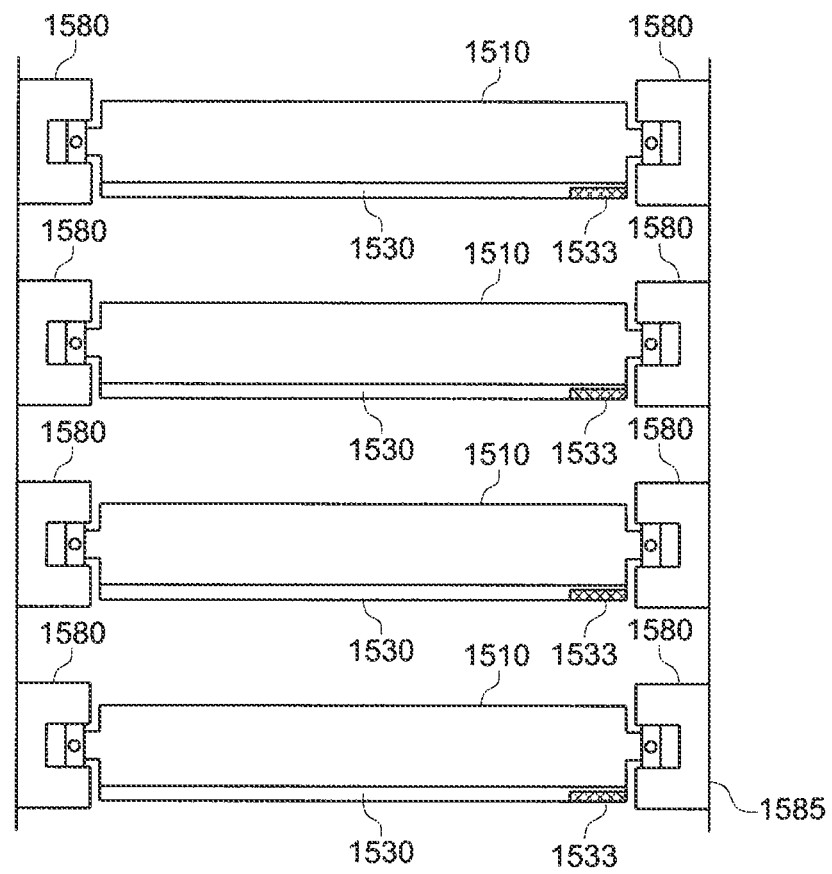
FIG. 15 comprises a front view of a group of circuit card assemblies assembled in a chassis according to various embodiments of the present invention.
Figure 16:
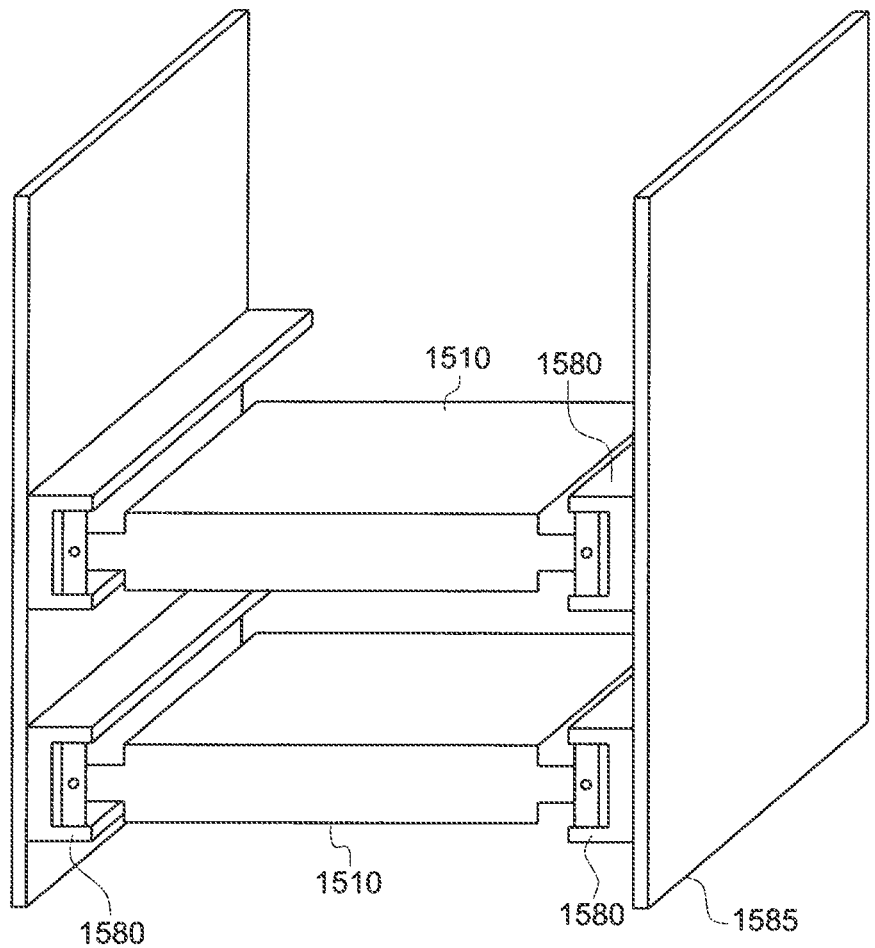
FIG. 16 comprises a perspective view of the group of circuit card assemblies shown in FIG. 15 according to various embodiments of the present invention.

Referring now to FIGS. 15-16, an example of a circuit card chassis that uses the assemblies of FIGS. 1-7 and/or FIGS. 8-14 is described. A chassis 1585 includes a plurality of circuit card assemblies 1510. The circuit card assemblies 1510 include the circuit board 1530 and circuit board external connector (not shown in the drawings for simplicity) and are connected to the chassis 1585 through holders 1580. The circuit card assemblies 1510 are restrained in the holders 1580 through the previously-mentioned locking mechanism (e.g., the locking mechanism 140 shown above). The circuit card assemblies 1510 slide into the holders 1580, whereupon the locking mechanism is rotated which creates the clamping restraining force on the circuit card assemblies.

By inserting the circuit card assemblies 1510 in the holders 1580 and chassis 1585, thermal energy is removed from the circuit card assembly 1510 to the holders 1580 and ultimately to the chassis 1585. This passive cooling allows the circuit card assembly 1510 to operate in a more efficient manner.

In one example, the running temperature of hot devices on the circuit board 130 are reduced by several degrees centigrade. These lower operating temperatures allow the circuit boards to be used at higher speeds with reduced concern for avoiding critical temperatures.

Referring now to FIG. 17, one example of a wedge that has a generally J-shaped cross section is described. The wedge 1700 includes a flat top and bottom surface to facilitate pressing against the external holder and movement along the longitudinal channel, respectively. This wedge can be used in the examples herein. Other shapes may also be used in the examples herein.

It will be appreciated by those skilled in the art that modifications to the foregoing embodiments may be made in various aspects. Other variations clearly would also work, and are within the scope and spirit of the invention. The present invention is set forth with particularity in the appended claims. It is deemed that the spirit and scope of that invention encompasses such modifications and alterations to the embodiments herein as would be apparent to one of ordinary skill in the art and familiar with the teachings of the present application.

What is claimed is:

1. A circuit card assembly, comprising:
   a heat sink, having a first portion and a second portion, the first portion of the heat sink being coupled to a circuit board, the second portion of the heat sink having an upper surface and a lower surface, the heat sink having longitudinal channel extending downward along the upper surface of the second portion of the heat sink;
   a locking mechanism disposed within the longitudinal channel of the heat sink, the locking mechanism comprising a plurality of solid wedges movably arranged within the longitudinal channel, each of the plurality of solid wedges formed without openings or channels there through, wherein a longitudinal movement of the plurality of solid wedges within the longitudinal channel to secures the circuit card assembly to an external holder by forcing one or more of the plurality of the solid wedges to rise in a direction perpendicular to the longitudinal channel, and wherein each of the plurality of solid wedges are generally T-shaped or J-shaped in a cross section that is partially contained by the longitudinal channel;
   a first thermal path formed from the circuit board through the first portion and the second portion of the heat sink to the lower surface of the heat sink, the first thermal path being configured to remove a first amount of thermal energy away from the circuit board;
   a second thermal path formed from the circuit board, through the first portion and the second portion of the heat sink, and then through the one or more of the plurality of solid wedges to the external holder, the second thermal path configured to remove a second amount of thermal energy from the circuit board.

2. The circuit card assembly of claim 1, further comprising a rod, the rod constructed of a material different from the heat sink, the rod extending longitudinally through the heat sink and forming an isothermal section in the heat sink.

3. The circuit card assembly of claim 2 wherein the rod is constructed of copper.

4. The circuit card assembly of claim 2 wherein the rod is a vapour chamber.

5. The circuit card assembly of claim 1 wherein a bottom surface of each of the plurality of solid wedges is generally flat.

6. The circuit card assembly of claim 1 wherein the locking mechanism further comprises a screw apparatus that is configured to, upon actuation, move the plurality of solid wedges.

7. The circuit card assembly of claim 6 wherein the locking mechanism further comprises a stopping mechanism that halts movement of the plurality of solid wedges along the longitudinal channel.

8. A circuit card assembly, comprising:
   a heat sink having a first portion and a second portion, the first portion coupling to a circuit board, the first portion and the second portion formed integrally together and connected via an integral neck portion, the second portion of the heat sink with an upper surface and a lower surface, the heat sink including a longitudinal channel extending downward along the upper surface of the second portion of the heat sink;
   a locking mechanism disposed within the longitudinal channel of the heat sink, the locking mechanism comprising a plurality of solid wedges movably arranged within the longitudinal channel, each of the plurality of solid wedges formed without openings there through, wherein a longitudinal movement of the plurality of solid wedges within the longitudinal channel secures the circuit card assembly to an external holder by forcing one or more of the plurality of the solid wedges to rise in a direction perpendicular to the longitudinal channel, and wherein each of the plurality of solid wedges are generally T-shaped or J-shaped in a cross section that is partially contained by the longitudinal channel;
   a first thermal path formed from the circuit board through the first portion of the heat sink, through the integral neck portion, through the second portion of the heat sink, to the lower surface of the heat sink, the first thermal path being configured to remove a first amount of thermal energy away from the circuit board;
   a second thermal path formed from the circuit board, through the first portion of the heat sink, through the second portion of the heat sink, and then through the one or more of the plurality of solid wedges to the external holder, the second thermal path configured to remove a second amount of thermal energy from the circuit board.

9. The circuit card assembly of claim 8, further comprising a rod, the rod constructed of a material different from the heat sink, the rod extending longitudinally through the heat sink and forming an isothermal section in the heat sink.

10. The circuit card assembly of claim 9 wherein the rod is constructed of copper.

11. The circuit card assembly of claim 9 wherein the rod is a vapour chamber.

12. The circuit card assembly of claim 8 wherein a bottom surface of each of the plurality of solid wedges is generally flat.

13. The circuit card assembly of claim 8 wherein the locking mechanism further comprises a screw apparatus that is configured to, upon actuation, move the plurality of solid wedges.

14. The circuit card assembly of claim 13 wherein the locking mechanism further comprises a stopping mechanism that halts movement of the plurality of solid wedges along the longitudinal channel.

* * * * *